(12) United States Patent
Kang

(10) Patent No.: US 6,337,273 B1
(45) Date of Patent: Jan. 8, 2002

(54) METHOD FOR FABRICATING CONTACT OF SEMICONDUCTOR DEVICE

(75) Inventor: Seong Hun Kang, Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/625,954
(22) Filed: Jul. 26, 2000
(30) Foreign Application Priority Data

Jul. 27, 1999 (KR) .............................................. 99-30630

(51) Int. Cl.[7] .............................................. H01L 21/44
(52) U.S. Cl. ........................ 438/652; 438/597; 438/612; 438/613
(58) Field of Search ................................. 438/652, 597, 438/612, 613, 618, 112, 124, 126, 127

(56) References Cited

U.S. PATENT DOCUMENTS 5,981,312 A * 11/1999 Farquada et al

* cited by examiner .

Primary Examiner—Kevin M. Picardat
Assistant Examiner—D. M. Collins
(74) Attorney, Agent, or Firm—Morgan, Lewis & Bockius LLP

(57) ABSTRACT

A method for fabricating a contact of a semiconductor device is disclosed, which efficiently removes an etching damage layer and residual layers when forming a contact of a semiconductor memory device, thereby improving a motion characteristic of the device. The method for fabricating a contact of a semiconductor device includes the steps of forming an insulating layer on a semiconductor substrate, forming a contact hole by selectively etching the insulating layer, so that a surface of the semiconductor substrate is exposed, primarily removing reaction by-products as well as a plasma damage layer at a bottom surface of a contact hole, with a pressure higher than that during the formation of the contact hole, and with a plasma source power and a bias power lower than those during the formation of the contact hole, and secondarily removing a residual plasma damage layer remaining after the primary removing, by an anisotropic etching with a light etching process.

18 Claims, 7 Drawing Sheets

METHOD FOR FABRICATING CONTACT OF SEMICONDUCTOR DEVICE

BACKGROUND OF THE INVENTION

1. Field of the Invention

The present invention relates to a semiconductor device, and more particularly, to a method for fabricating a contact of a semiconductor device which efficiently removes an etching damage layer and a residual layer when fabricating a contact of a semiconductor memory device, thereby improving a motion characteristic of the device.

2. Background of the Related Art

Generally, in a device above 64M DRAM, a Self Aligned Contact(SAC) process is used when fabricating a contact which connects a capacitor and a cell transistor.

The Self Aligned Contact is formed by a dry etching process using a plasma. The plasma consists of free electrons generated by an RF discharge at a low pressure of 0.01~10 torr and etching gas ions, and is chemically very active to react with atoms of surrounding layers. If the plasma becomes volatile when reacted with the atoms of the surrounding layers, a compound of the plasma and the atoms is evaporated from the surface of a semiconductor substrate.

Meanwhile, when manufacturing a semiconductor device, a photoresist, a polysilicon layer, a metal layer or their layered film are also dry etched, and particularly, the metal layer is etched using a $Cl_2$, and the polysilicon layer using $SF_6$. A silicon oxide film ($SiO_2$) is etched using $CF_4$, and the photoresist using $O_2$.

In this instance, since the $SiO_2$ is used as an insulating layer between the capacitor and the cell transistor, the $CF_4$ is used for etching the insulating layer. On the other hand, $C_4F_8$ is usually used in the SAC process.

The related art method for fabricating a contact of a semiconductor device will be described below with reference to the attached drawings.

FIGS. 1a to 1g illustrate sections showing the related art Process steps for fabricating a contact of a semiconductor device, and FIG. 2 illustrates a section showing a lower structure of a contact hole after performing a light etching for completely removing a plasma damage region.

First, as shown in FIG. 1a, a gate oxide film 3 is formed on a semiconductor 1, at which an active region and a device isolation region are defined by a field oxide film 2.

Subsequently, as shown in FIG. 1b, a doped polysilicon 4, a tungsten silicide (WSi) 5, and a nitride film ($Si_3N_4$) 6 are sequentially deposited on the gate oxide film 4.

Then, as shown in FIG. 1c, a photoresist (not shown) is applied on the nitride film 6, and is patterned by exposing and developing process. The oxide film 6, the tungsten silicide 5, the doped polysilicon 4, and the gate oxide film 3 are then selectively etched using the patterned photoresist film as a mask, to form gate and cap insulating layers 4a, 5a and 6a.

Thereafter, a low concentration impurity ion is implanted using the gate and cap insulating layers 4a, 5a and 6a as masks, to form a low concentration impurity region 7 within a surface of the semiconductor substrate 1 at both sides of the gate, in order to be used as a Lightly Doped Drain (LDD).

Subsequently, as shown in FIG. 1d, a nitride film $Si_3N_4$ is deposited on an entire surface of the semiconductor substrate 1 which is exposed, including the gate and cap insulting layers 4a, 5a and 6a. The nitride film is then etched back, to form a gate sidewall 8 at sides of the gate and cap insulating layers 4a, 5a and 6a. Then, a high concentration impurity ion is implanted using the gate and cap insulating layers 4a, 5a and 6a, including the sidewall 8, as a mask, to form a source/drain region 9 of an LDD structure.

As shown in FIG. 1e, an insulating layer 10 is formed on an entire surface of the semiconductor substrate 1 including the gate and cap insulating layers 4a, 5a and 6a. Then, a photoresist 11 is applied thereon and is selectively patterned, to form a storage node contact mask.

As shown in FIG. 1f, the exposed insulating layer 10 is selectively etched by the SAC process using a plasma etching device, using the selectively patterned photoresist 11 as a mask, to form a contact hole 12. At this instance, a large quantity of carbon (C) ions are generated during the etching process, because the $C_4F_8$ is implanted within the etching device to induce the plasma. The $C_4F_8$ is used to improve an efficiency of the SAC process.

An SiC layer 13 is formed on a surface of the semiconductor substrate 1 by the carbon ions, at which a contact hole 12 is formed. Referring to an enlarged view of FIG. 1f, it is understood that a plasma damage layer 14 and the SiC layer 13 are formed at a bottom surface of the contact hole 12 (a surface of the semiconductor substrate), during the etching of plasma.

The SiC layer 13 is formed of a carbon component of the $C_4F_8$ and Si of the semiconductor substrate 1, and the plasma damage layer is a part in which Si gratings are damaged by a physical damage of the plasma.

The SiC layer 13 and the plasma damage layer 14 increase a contact resistance between a capacitor and a cell transistor which will be formed at a later process, as well as generating a leakage current.

Accordingly, as shown in FIG. 1g, a light etching process for removing the SiC layer 13 and the plasma damage layer 14 is performed after removing the photoresist 11, using an additional etching device having anisotropic low etching ratio.

During this light etching process, a substantial amount of $O_2$ is used for preventing a re-formation of the SiC layer.

However, even if the process for removing the Sic layer 13 and the plasma damage layer 14 is performed using the light etch process, a residual SiC layer+plasma damage layer 15 is remained on a surface of the semiconductor substrate, as shown in an enlarged view of FIG. 1g.

If, as shown in FIG. 2, a time of the light etching process is increased for removing the residual SiC+plasma damage layer 15, an isotropic etching ratio is increased accordingly even if the etching device having isotropic low etching ratio is used for the light etching process.

That is, inner parts of the source/drain region 9 with the LDD structure are dented, as in the part A shown in FIG. 2.

It is apparent that, by performing the light etching process in the SAC process, a restoration ratio of life time is improved.

FIG. 3 illustrates a change in the life time when using a TCA 3822 light etching device. As shown in the drawing, a time from excitation of electrons to extinction thereof is increased, if the light etching is performed with sufficient time. FIG. 3 illustrates a result of the light etching using only a source power, under a condition of 600 mTorr, 100 W, 45 $O_2$ and 35 $CF_4$.

However, the related art method for fabricating a contact of a semiconductor device has the following problems.

First, since an additional etching device having anisotropic low etching ratio is used for a long time instead of using an etching device used in the SAC process, a Turn Around Time (TAT) is increased and maintaining the device becomes difficult.

Second, in case of a general light etching process for removing the SiC layer and the plasma damage layer formed during the SAC process, a contact resistance is increased, as well as a leakage of current stored in the capacitor, because of the residual SiC layer+plasma damage layer.

As a result, a motion characteristic of a device is deteriorated. Particularly, in case of a memory device such as a DRAM, a reliability of the device is deteriorated because of inequality in refreshing movements, or reduction of refreshing time.

Finally, when the time of light etching is increased for removing the residual SiC layer and the plasma damage layer, the process becomes an isotropic etching. Accordingly, an inner part of the source/drain region with an LDD structure is damaged, thereby causing an inequality in the motion characteristic of the device, as well as deteriorating an yield.

SUMMARY OF THE INVENTION

Accordingly, the present invention is directed to a method for fabricating a contact of a semiconductor device that substantially obviates one or more of the problems due to limitations and disadvantages of the related art.

An object of the present invention is to provide a method for fabricating a contact of a semiconductor device for efficiently removing an etching damage layer and a residual layer when fabricating a contact of a semiconductor memory device, thereby improving a motion characteristic of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a contact of a semiconductor device in accordance with the present invention includes the steps of forming an insulating layer on a semiconductor substrate, forming a contact hole by selectively etching the insulating layer, so that a surface of the semiconductor substrate is exposed, primarily removing reaction by-products as well as a plasma damage layer at a bottom surface of a contact hole, with a pressure higher than that during the forming of the contact hole, and with a plasma source power and a bias power lower than those during the formation of the contact hole, and secondarily removing a residual plasma damage layer remaining after the primary removing step, by an anisotropic etching with a light etching process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 4a to 4h illustrate sections showing process steps of fabricating a contact of a semiconductor device in accordance with the present invention. In accordance with the present invention, an SiC layer and a plasma damage region formed during an SAC process for forming a contact hole are primarily removed within an etching device which was used during the SAC process, and then, a light etching is performed, thereby easily removing the SiC layer and the plasma damage layer.

The process for fabricating a contact of a semiconductor in accordance with the present invention will be explained in detail.

Figure 1A:
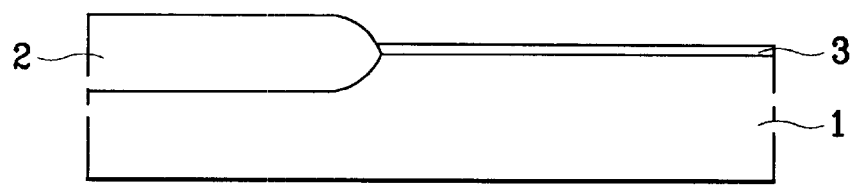
FIGS. 1a to 1g illustrate sections showing the related art process steeps of fabricating a contact of a semiconductor device.
Figure 1B:
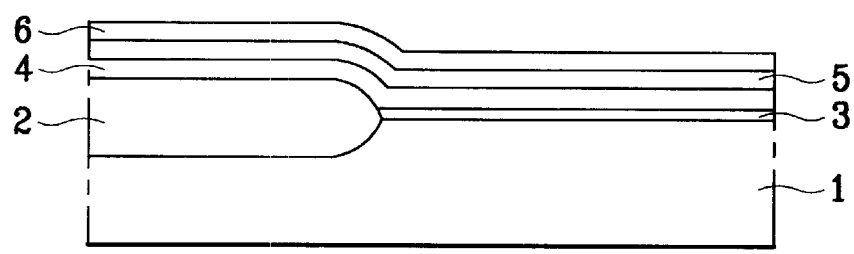
Figure 1C:
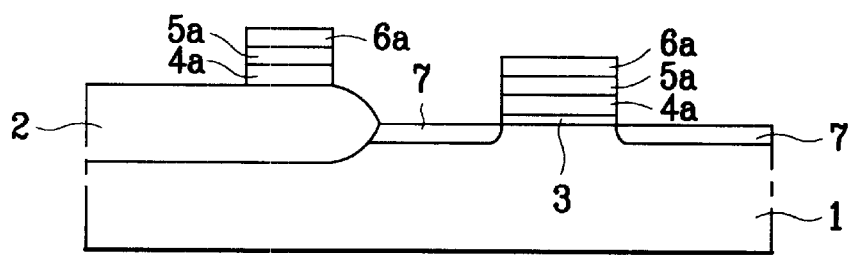
Figure 1D:
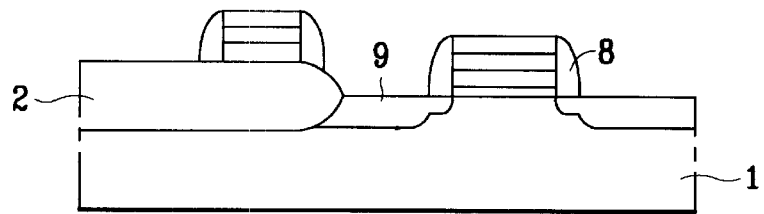
Figure 1E:
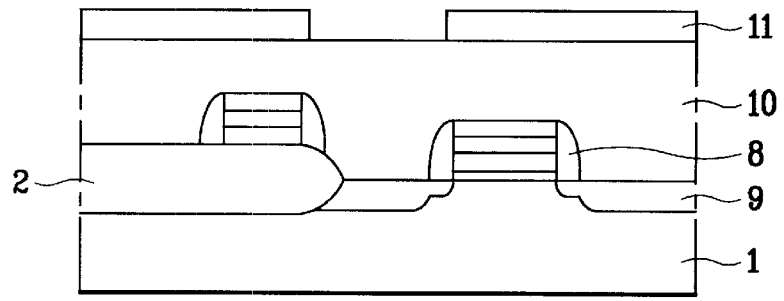
Figure 1F:
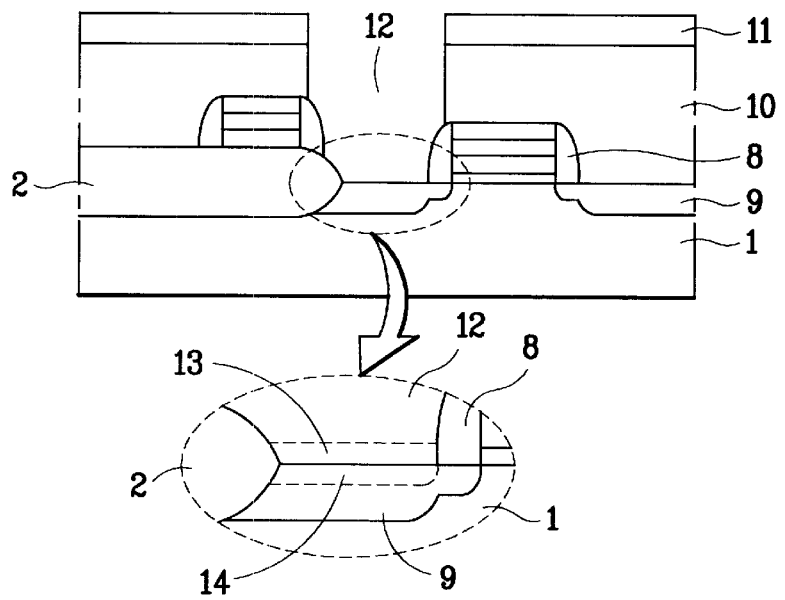
Figure 1G:
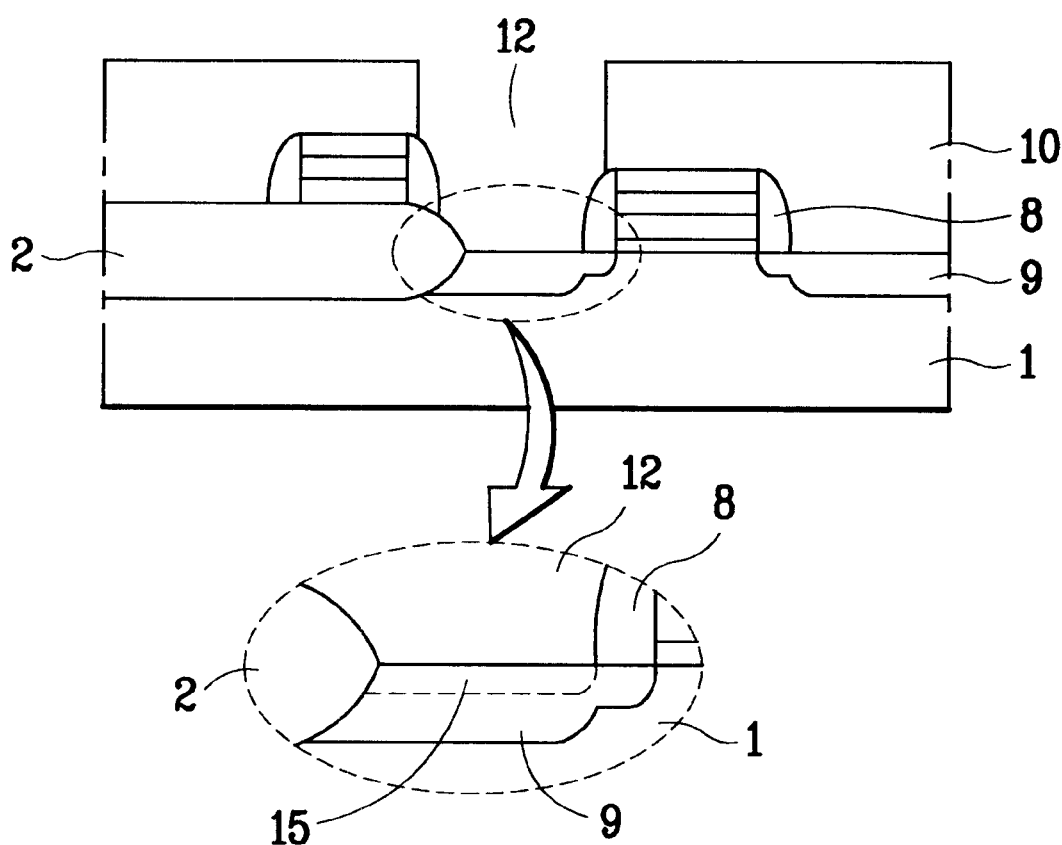
Figure 2:
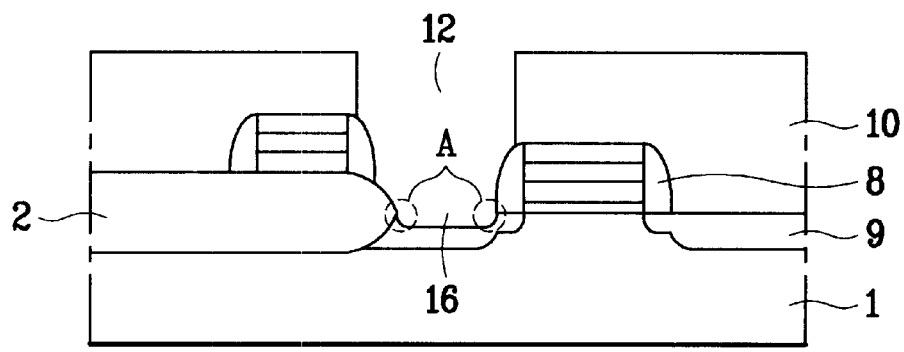
FIG. 2 illustrates a section showing a lower structure of a contact hole after a light etching for completely removing a plasma damage region.
Figure 3:
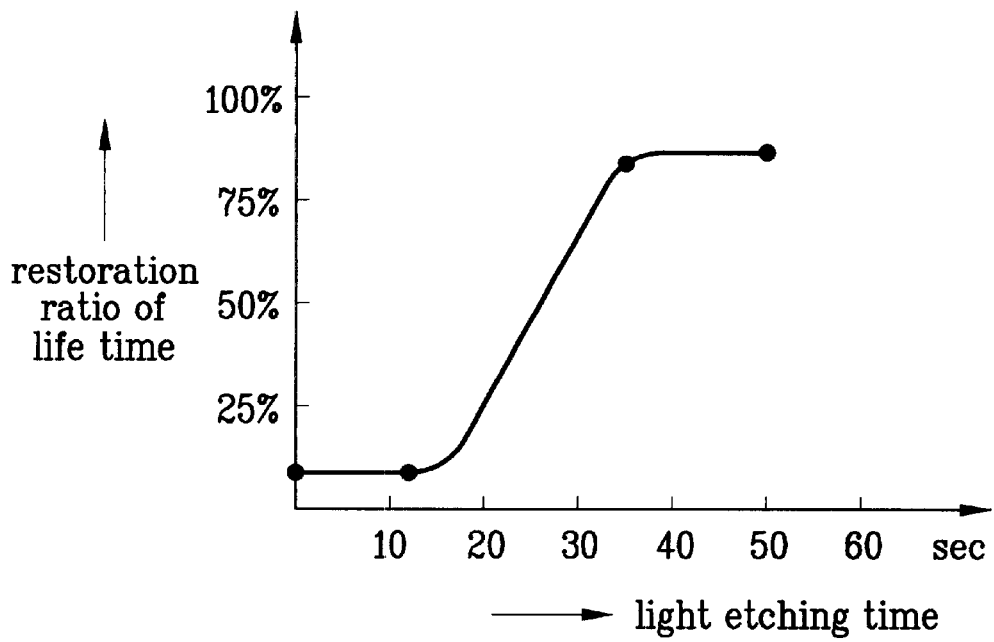
FIG. 3 illustrates a graph showing a restoration ratio of life time in accordance with light etching time.
Figure 4A:
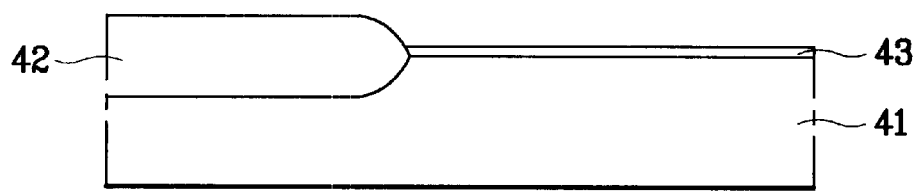
FIGS. 4a to 4h illustrate sections showing process steps of fabricating a contact of a semiconductor device in accordance with the present invention.
Figure 4B:
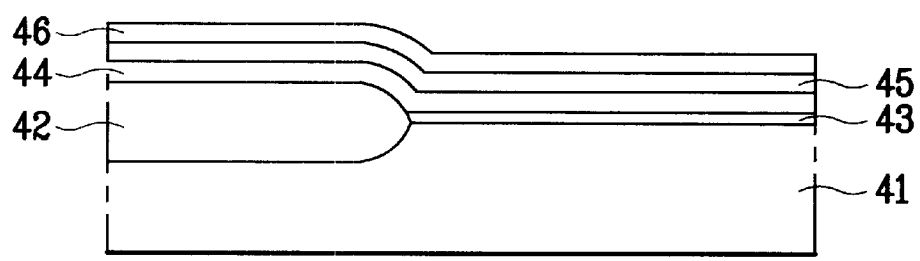

First, as shown in FIG. 4a, a gate insulating film 43 is formed on a semiconductor substrate 41, at which an active region and a device isolation region are defined by a field oxide film 42. Then, as shown in FIG. 4b, a doped polysilicon 44, a tungsten silicide (WSi) 45, and a nitride film 46 are deposited on the gate oxide film 43.

Figure 4C:
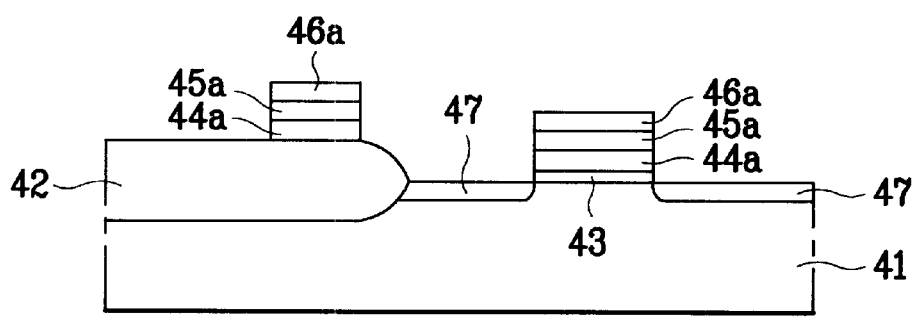

Subsequently, as shown in FIG. 4c, a photoresist (not shown) is applied on the nitride film 46, and is patterned with exposing and developing. Then, gate and cap insulating layers 44a, 45a and 46a are formed by selectively etching the nitride film 46, the tungsten silicide 45, the doped polysilicon 44, and the gate oxide film 43, using the patterned photoresist as a mask.

Then, a low concentration impurity ion is implanted using the gate and cap insulating layers 44a, 45a and 46a as masks, to form low concentration impurity regions 47 within a surface of the single crystal silicon substrate 41 at both sides of the gate, in order to be used as a Lightly Doped Drain (LDD) region.

Figure 4D:
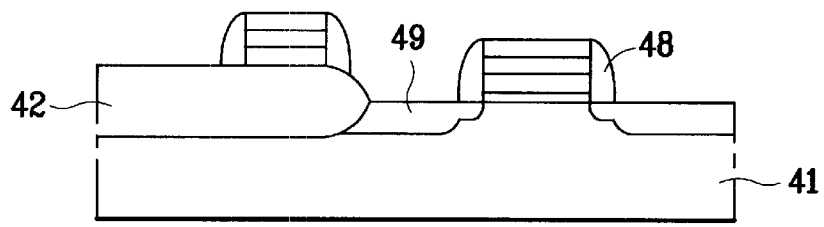

Thereafter, as shown in FIG. 4d, a nitride film ($Si_3N_4$) is deposited on an entire surface of the semiconductor substrate 41 including the gate and cap insulating layers 44a, 45a and 46a. The nitride film is then etched back, to form a gate sidewall at a side of gate and cap insulating layers 44a, 45a and 46a.

A low concentration impurity ion is then implanted using the gate and cap insulating layers 44a, 45a and 46a including the gate sidewall 48 as masks, to form a source/drain region 49 having the LDD structure within the semiconductor substrate 41.

Figure 4E:
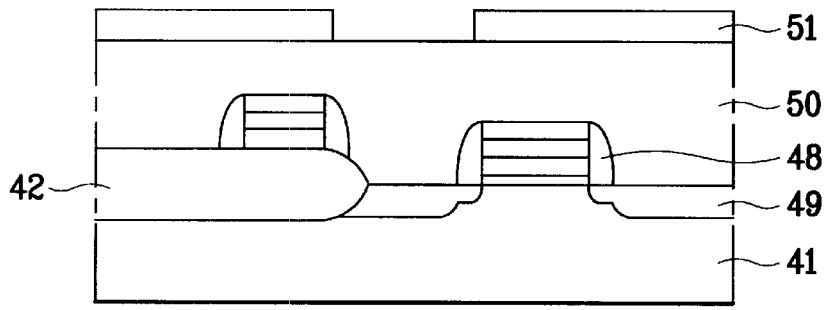

As shown in FIG. 4e, an insulating layer 50 is formed on an entire surface of the semiconductor substrate 41 including the gate and cap insulating layers 44a, 45a and 46a. A photoresist 51 is applied thereon, and is selectively patterned to form a storage node contact mask.

Figure 4F:
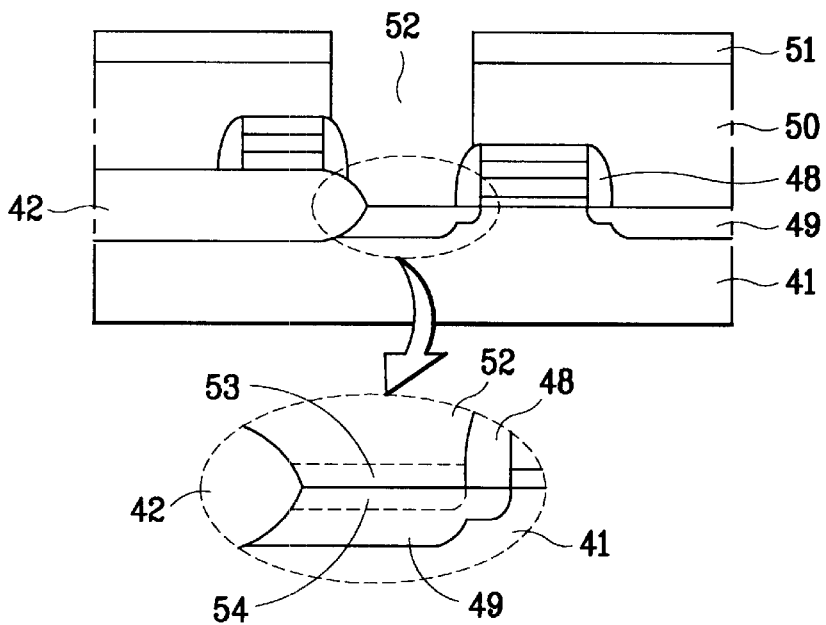

Subsequently, as shown in FIG. 4f, the exposed insulating layer 50 is selectively etched with the SAC process using a plasma etching device, with the selectively patterned photoresist 41 as a mask, to form a contact hole 52. At this instance, a large quantity of carbon (C) ions are generated during the etching process, because the $C_4F_8$ is implanted within the etching device to induce the plasma.

An SiC layer 53 is formed on a surface of the semiconductor substrate 41 by the carbon ions, at which a contact hole 52 is formed. Referring to an enlarged view of FIG. 4f, it is understood that a plasma damage layer 54 and the SiC layer 53 are formed at a bottom surface of the contact hole 52 (a surface of the semiconductor substrate), during the etching of plasma.

The SiC layer 53 is formed of a carbon component of the $C_4F_8$ and Si of the semiconductor substrate 41, and the plasma damage layer 54 is a part in which Si gratings are damaged by a physical damage of the plasma.

The SiC layer 53 and the plasma damage layer 54 increase a contact resistance between a capacitor and a cell transistor which will be formed at a later process, as well as generating a leakage current.

Accordingly, the SiC layer 53 and the plasma damage layer 54 are removed by the following process in accordance with the present invention.

Figure 4G:
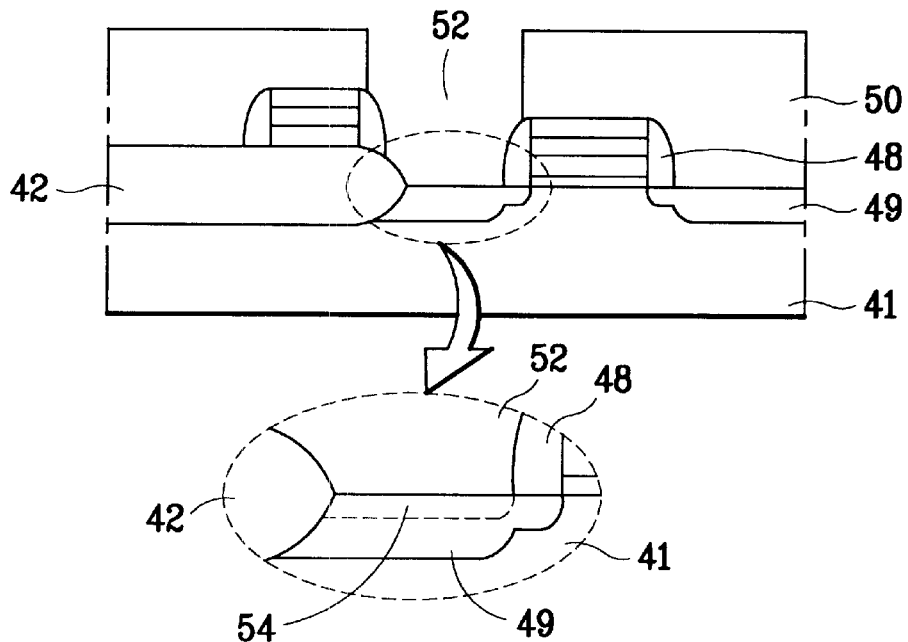

In the present invention, as shown in FIG. 4g, $CF_4$, Ar, and $O_2$ are successively implanted into the etching device using the etching device which was used in the SAC process, before performing a light etching process. That is, after performing the SAC process, the $CF_4$ of 20~30 sccm, the Ar of 200~400 sccm, and the $O_2$ of 15~25 sccm are flown within the plasma etching device, in a state that a pressure within the same etching device is maintained at 760~100 mtorr. After implanting the gases, a source power of 400~500 watt and a bias power of 40~50 watt are applied, to induce the plasma.

At this instance, the plasma includes $F^+F^*$, O+and O*, and the plasmas etch the SiC layer 53 and the plasma damage layer 54 as a primary etching process.

By-products of the primary etching process are removed in the primary etching process. For removing the by-products, a large quantity of $O_2$ is implanted during the etching process.

Since the primary etching process is an anisotropic etching, the substrate is not damaged at an inner part of the source/drain region with the IDD structure, even when the contact process is completed by performing the light etching as a final process.

For reducing the damage of a semiconductor substrate, in accordance with the method for fabricating a Self Aligned Contact in accordance with the present invention, several conditions have to be satisfied. First, a pressure within the etching device should be increased (up to 70~100 torr). Second, the plasma source power and the bias power should be decreased (up to 400~500 watt and 40~50 watt, respectively). Finally, a large quantity of O2should be used. By performing the primary etching, the Sic layer 53 and the plasma damage layer 54 are removed, only to remain a part of the plasma damage layer 54.

Figure 4H:
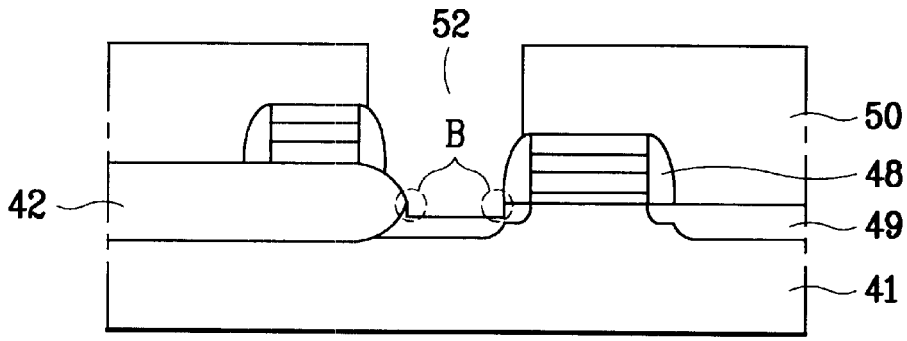

Subsequently, as shown in FIG. 4h, a light etching is performed for removing the residual plasma damage layer 54 using the etching device having anisotropic low etching ratio.

At this instance, since the SiC layer 53 and the plasma 54 are already removed except the part of the plasma damage layer 54 by the primary etching, a damage layer at a surface of the semiconductor substrate 41 is removed by the anisotropic etching, without increasing the time of light etching process.

That is, since the time of light etching is not increased, the process is finished, leaving a vertical etching profile, as shown in part B of FIG. 4h. Therefore, the inner part of the LDD region in a substrate is not damaged.

As aforementioned, the method for forming a contact of a semiconductor device in accordance with the present invention has the following advantages.

First, since the light etching is performed after removing the SiC layer and the plasma damage layer by the primary etching sequentially performed by the plasma etching device which was used at the SAC process, the light etching time is reduced. Therefore, it is advantageous in the aspect of the TAT and the maintenance of the device.

Second, since the by-products and the substrate damage layer are removed by a primary etching before performing the light etching, the by-products and the substrate damage layer are efficiently removed with a short etching time.

Third, the efficient removal of the by-products and the substrate damage layer in the SAC process prevents an increase in a contact resistance, and a leakage of current stored in a capacitor. This improves a motion characteristic of the device, and particularly, in a memory device such as a DRAM, an equality in refreshing movements can be ensured, or periods of refreshing time can be maintained.

Finally, since the isotropic etching is limited in the light etching for removing the residual SiC layer and the plasma damage layer, the inner part of the source/drain region with the LDD structure is not damaged.

It will be apparent to those skilled in the art that various modifications and variations can be made in the method for fabricating a contact of a semiconductor device according to the present invention without departing from the spirit or scope of the invention. Thus, it is intended that the present invention covers the modifications and variations of the invention provided they come within the scope of the appended claims and their equivalents.

What is claimed is:

1. A method for fabricating a contact of a semiconductor device, comprising the steps of:

forming an insulating layer on a semiconductor substrate;

forming a contact hole by selectively etching the insulating layer, so that a surface of the semiconductor substrate is exposed;

primarily removing reaction by-products as well as a plasma damage layer at a bottom surface of the contact hole, with a pressure higher than that during the formation of the contact holes, and with a plasma source power and a bias power lower than those during the formation of the contact hole; and secondarily removing a residual plasma damage layer remaining after the primary removing step, by anisotropic etching with a light etching process.

2. The method as claimed in claim 1, wherein the insulating layer is etched by a plasma etching process using $C_4F_8$, when forming the contact hole.

3. The method as claimed in claim 1, wherein the reaction by-products includes an SiC film.

4. The method as claimed in claim 1, wherein the primary removing step of the reaction by-products and the plasma damage layer is performed by supplying $CF_4$ of 20~30 sccm, Ar of 200~400 sccm, and $O_2$of 15~25 sccm.

5. The method as claimed in claim 1, wherein the primary removing step of the reaction by-products and the plasma damage layer is performed at a pressure of 70~100 mTorr.

6. The method as claimed in claim 1, wherein the primary removing step of the reaction by-products and the plasma damage layer is performed at a source power of 400~500 watt and a bias power of 40~50 watt.

7. The method as claimed in claim 1, wherein the primary removing step of the reaction by-products and the plasma damage layer is sequentially performed within a plasma etching device used when forming the contact hole.

8. The method as claimed in claim 1, wherein the light etching is performed using an etching device having isotropic low etching ratio.

9. The method as claimed in claim 1, to form a cell transistor before forming the insulating layer on the semiconductor substrate, further comprising the steps of:

forming a field oxide film at a device isolation region of the semiconductor substrate to define an active region;
   forming a gate oxide film on the active region of the semiconductor substrate;
   forming a gate on the gate oxide film;
   forming a low concentration impurity region on a surface of the semiconductor substrate at both sides of the gate;
   forming a gate sidewall at a side of the gate; and
   forming a source/drain region with an LDD structure within the semiconductor substrate, by implanting a high concentration impurity ion using the gate including the gate sidewall as a mask.

10. The method as claimed in claim 9, wherein the gate sidewall is formed by depositing a nitride film on an entire surface of the semiconductor substrate including the gate and etching back the nitride film.

11. The method as claimed in claim 9, wherein a doped polysilicon, a tungsten silicide, and a nitride film are sequentially deposited on the gate oxide film and selectively etched, to form the gate in which the doped polysilicon and the tungsten silicide are layered, wherein a cap insulating layer is formed on an upper part of the gate.

12. A method for fabricating a contact of a semiconductor device, the method comprising the steps of:

forming a gate on a semiconductor substrate;
   forming a low concentration impurity region in a surface of the semiconductor substrate at both sides of the gate;
   forming a gate sidewall at a side of the gate;
   forming a source/drain region with an LDD structure within the semiconductor substrate, by implanting a high concentration impurity ion into the semiconductor substrate using the gate including the gate sidewall as a mask;
   forming an insulating layer on an entire surface of the semiconductor substrate;
   forming a contact hole by selectively etching the insulating layer to expose the surface of the semiconductor substrate;
   primarily removing reaction by-products and a plasma damage layer at a bottom surface of the contact hole by supplying $CF_4$, Ar, and $O_2$ under the condition of a pressure of 70~100 mTorr, a source power of 400~500 watt, and a bias power of 40~50 watt; and
   secondarily removing a residual plasma damage layer remaining after the primary removing step, by the anisotropic etching with a light etching process.

13. The method as claimed in claim 12, wherein the insulating layer is etched by a plasma etching process using $C_4F_8$, when forming the contact hole.

14. The method as claimed in claim 12, wherein the reaction by-products includes an SiC layer.

15. The method as-claimed in claim 12, wherein the primary removing step of the reaction by-products and the plasma damage layer is performed by supplying $CF_4$ of 20~30 sccm, Ar of 200~400 sccm, and $O_2$ of 15~25 sccm.

16. The method as claimed in claim 12, wherein the primary removing step of the reaction by-products and the plasma damage layer is sequentially performed within a plasma etching device used when forming the contact hole.

17. The method as claimed in claim 12, wherein the light etching is performed using an etching device having isotropic low etching ratio.

18. The method as claimed in claim 12, wherein the contact hole is formed by an SAC process using the gate sidewall formed at a side of the gate as a gate protection layer.

* * * * *